United States Patent
Ames et al.

(10) Patent No.: US 9,787,345 B2
(45) Date of Patent: Oct. 10, 2017

(54) LASER WELDING OF TRANSPARENT AND OPAQUE MATERIALS

(71) Applicant: Apple Inc., Cupertino, CA (US)

(72) Inventors: Logan M. Ames, Palo Alto, CA (US); Michael M. Li, San Jose, CA (US)

(73) Assignee: APPLE INC., Cupertino, CA (US)

( * ) Notice: Subject to any disclaimer, the term of this patent is extended or adjusted under 35 U.S.C. 154(b) by 59 days.

(21) Appl. No.: 14/230,324

(22) Filed: Mar. 31, 2014

(65) Prior Publication Data
US 2015/0280767 A1   Oct. 1, 2015

(51) Int. Cl.
*B23K 26/21* (2014.01)
*B23K 26/24* (2014.01)
(Continued)

(52) U.S. Cl.
CPC ....... *H04B 1/3888* (2013.01); *B23K 26/0063* (2013.01); *B23K 26/10* (2013.01); *B23K 26/26* (2013.01); *B23K 26/32* (2013.01); *B23K 26/40* (2013.01); *B23K 26/57* (2015.10); *B29C 65/1638* (2013.01); *B29C 66/242* (2013.01); *B29C 66/303* (2013.01); *B29C 66/30325* (2013.01); *B32B 37/06* (2013.01); *B32B 37/12* (2013.01); *B32B 37/142* (2013.01); (Continued)

(58) Field of Classification Search
None
See application file for complete search history.

(56) References Cited

U.S. PATENT DOCUMENTS 3,217,088 A * 11/1965 Steierman ............... C03B 23/20
                                                       148/DIG. 71
3,424,890 A *  1/1969 Van Ruyven ....... B29C 65/1435
                                                       148/DIG. 49
(Continued)

FOREIGN PATENT DOCUMENTS

CN       1561277        1/2005
CN       1757468        4/2006
(Continued)

OTHER PUBLICATIONS

English Abstract for JP 56005363 A, Jan. 1981.*
(Continued)

*Primary Examiner* — Jeff Vonch
(74) *Attorney, Agent, or Firm* — Brownstein Hyatt Farber Schreck, LLP

(57) ABSTRACT

Welding of transparent material in electronic devices. An electronic device may include an enclosure having at least one aperture formed through a portion of the enclosure. The electronic device may also include a component positioned within the aperture formed through the portion of the enclosure. The component may be laser welded to the aperture formed through the enclosure. Additionally, the component may include transparent material. A method for securing a component within an electronic device may include providing an electronic device enclosure including at least one aperture, and positioning a component within the aperture formed through the enclosure. The component positioned within the aperture may include a transparent material. The method may also include welding the component to the electronic device enclosure.

17 Claims, 13 Drawing Sheets

(51) Int. Cl.

| | | |
|---|---|---|
| B23K 26/32 | (2014.01) | |
| B23K 103/18 | (2006.01) | |
| B32B 3/24 | (2006.01) | |
| B32B 7/02 | (2006.01) | |
| B32B 7/04 | (2006.01) | |
| B32B 3/02 | (2006.01) | |
| B32B 37/06 | (2006.01) | |
| B32B 38/00 | (2006.01) | |
| H04B 1/3888 | (2015.01) | |
| H04M 1/725 | (2006.01) | |
| H05K 5/00 | (2006.01) | |
| B23K 26/00 | (2014.01) | |
| B32B 37/14 | (2006.01) | |
| B32B 37/18 | (2006.01) | |
| B32B 37/12 | (2006.01) | |
| B23K 26/57 | (2014.01) | |
| B23K 26/10 | (2006.01) | |
| B23K 26/26 | (2014.01) | |
| B23K 26/40 | (2014.01) | |
| H05K 5/03 | (2006.01) | |
| B29C 65/16 | (2006.01) | |
| B29C 65/00 | (2006.01) | |
| B32B 3/26 | (2006.01) | |
| B23K 26/60 | (2014.01) | |
| B23K 103/00 | (2006.01) | |
| B23K 103/08 | (2006.01) | |
| B23K 26/324 | (2014.01) | |
| B23K 101/36 | (2006.01) | |
| B32B 7/00 | (2006.01) | |
| H04M 1/02 | (2006.01) | |
| G06F 1/16 | (2006.01) | |
| B29L 31/34 | (2006.01) | |
| H05K 5/06 | (2006.01) | |
| H05K 5/04 | (2006.01) | |

(52) U.S. Cl.
CPC .......... B32B 37/18 (2013.01); B32B 38/0008 (2013.01); H04M 1/72519 (2013.01); H05K 5/0004 (2013.01); *B23K 26/324* (2013.01); *B23K 26/60* (2015.10); *B23K 2201/36* (2013.01); *B23K 2203/08* (2013.01); *B23K 2203/18* (2013.01); *B23K 2203/42* (2015.10); *B23K 2203/50* (2015.10); *B23K 2203/52* (2015.10); *B23K 2203/54* (2015.10); *B29C 65/16* (2013.01); *B29C 65/1629* (2013.01); *B29C 65/1654* (2013.01); *B29C 66/02* (2013.01); *B29C 66/114* (2013.01); *B29C 66/1142* (2013.01); *B29C 66/1162* (2013.01); *B29C 66/24221* (2013.01); *B29C 66/70* (2013.01); *B29C 66/72* (2013.01); *B29C 66/73116* (2013.01); *B29C 66/73361* (2013.01); *B29C 66/73365* (2013.01); *B29L 2031/3481* (2013.01); *B32B 3/02* (2013.01); *B32B 3/266* (2013.01); *B32B 7/005* (2013.01); *B32B 7/02* (2013.01); *B32B 7/04* (2013.01); *B32B 7/045* (2013.01); *B32B 2307/412* (2013.01); *B32B 2310/0843* (2013.01); *B32B 2457/00* (2013.01); *B32B 2457/20* (2013.01); *C04B 2237/76* (2013.01); *C04B 2237/78* (2013.01); *G06F 1/1626* (2013.01); *G06F 1/1637* (2013.01); *H04M 1/026* (2013.01); *H04M 1/0249* (2013.01); *H04M 1/0264* (2013.01); *H04M 1/0266* (2013.01); *H05K 5/03* (2013.01); *H05K 5/04* (2013.01); *H05K 5/066* (2013.01); *Y10T 428/13* (2015.01); *Y10T 428/24322* (2015.01); *Y10T 428/24331* (2015.01); *Y10T 428/24339* (2015.01); *Y10T 428/24488* (2015.01); *Y10T 428/24521* (2015.01); *Y10T 428/24777* (2015.01)

(56) References Cited

U.S. PATENT DOCUMENTS

| | | | | |
|---|---|---|---|---|
| 3,911,670 | A * | 10/1975 | Hofer | G04B 37/08 368/280 |
| 3,955,021 | A * | 5/1976 | Cleavenger | G01D 11/26 324/156 |
| 4,036,623 | A * | 7/1977 | Deeg | C03C 3/078 501/64 |
| 4,424,435 | A * | 1/1984 | Barnes, Jr. | B23K 26/18 219/121.64 |
| 4,433,921 | A * | 2/1984 | Gogniat | G04B 39/002 368/294 |
| 4,636,609 | A * | 1/1987 | Nakamata | B29C 37/0082 219/121.64 |
| 4,849,299 | A * | 7/1989 | Loth | C30B 33/00 427/527 |
| 4,879,450 | A * | 11/1989 | Valentin | B23K 26/18 219/121.64 |
| 5,028,162 | A * | 7/1991 | Tsuno | C04B 37/026 403/272 |
| 5,534,103 | A * | 7/1996 | Yano | C04B 37/025 156/272.2 |
| 5,893,959 | A * | 4/1999 | Muellich | B29C 65/1654 156/272.8 |
| 6,210,507 | B1 * | 4/2001 | Hansen | B29C 65/1635 156/109 |
| 6,451,398 | B1 | 9/2002 | Sylvester | |
| 6,459,460 | B1 * | 10/2002 | Yamanaka | G02F 1/133308 349/58 |
| 6,501,044 | B1 * | 12/2002 | Klockhaus | C03C 23/0025 219/121.64 |
| 6,627,814 | B1 * | 9/2003 | Stark | B81B 7/0067 174/539 |
| 6,670,021 | B2 | 12/2003 | Schroder et al. | |
| 6,752,893 | B2 * | 6/2004 | Frieder, Jr. | B29C 66/7392 156/272.2 |
| 6,767,624 | B2 | 7/2004 | Bronstert | |
| 6,827,812 | B2 | 12/2004 | Woods | |
| 7,635,516 | B2 | 12/2009 | Arimitsu et al. | |
| 7,776,437 | B2 | 8/2010 | Kim | |
| 7,811,647 | B2 | 10/2010 | Arimitsu et al. | |
| 7,910,206 | B2 | 3/2011 | Kiuchi et al. | |
| 7,929,224 | B2 | 4/2011 | Liu et al. | |
| 8,060,168 | B2 | 11/2011 | Horrdin et al. | |
| 8,153,250 | B2 | 4/2012 | Nakayama et al. | |
| 8,570,729 | B2 | 10/2013 | Prest et al. | |
| 8,780,579 | B2 | 7/2014 | Kwon et al. | |
| 8,852,330 | B2 | 10/2014 | Naess et al. | |
| 2001/0028567 | A1 * | 10/2001 | Akiyama | B29C 65/1635 362/520 |
| 2003/0071269 | A1 * | 4/2003 | Tseng | B81B 1/00 257/98 |
| 2003/0222061 | A1 * | 12/2003 | Langer | H01L 51/5246 219/121.66 |
| 2004/0149809 | A1 * | 8/2004 | Weekamp | B32B 18/00 228/174 |
| 2004/0150688 | A1 * | 8/2004 | Kwan | B23K 26/032 347/19 |
| 2004/0231788 | A1 * | 11/2004 | Chen | B29C 65/1635 156/272.8 |
| 2004/0237422 | A1 * | 12/2004 | Tat | B23K 26/244 52/79.1 |
| 2005/0042456 | A1 * | 2/2005 | Krause | B29C 37/0082 428/411.1 |
| 2005/0067084 | A1 * | 3/2005 | Kagan | B29C 45/16 156/64 |
| 2005/0082265 | A1 * | 4/2005 | Yamabuki | B29C 66/73341 219/121.64 |

(56) References Cited

U.S. PATENT DOCUMENTS

| | | | |
|---|---|---|---|
| 2005/0100703 A1* | 5/2005 | Terada | B29C 65/1635 428/57 |
| 2006/0077575 A1* | 4/2006 | Nakai | B29C 65/1664 359/819 |
| 2007/0141805 A1* | 6/2007 | Chang | B01L 3/502707 438/456 |
| 2007/0194086 A1* | 8/2007 | Yuura | B29C 66/73921 228/101 |
| 2007/0295719 A1* | 12/2007 | Yamazaki | B29C 66/542 220/4.01 |
| 2008/0024887 A1 | 1/2008 | Noda et al. | |
| 2008/0063218 A1* | 3/2008 | Weber | H04R 1/02 381/87 |
| 2008/0086033 A1* | 4/2008 | Mihalca | A61B 1/00105 600/160 |
| 2008/0093348 A1* | 4/2008 | Seita | B29D 11/00009 219/121.63 |
| 2008/0144196 A1* | 6/2008 | Kitamura | B29C 65/14 359/819 |
| 2009/0017263 A1* | 1/2009 | Yeates | B22D 19/04 428/167 |
| 2009/0049773 A1* | 2/2009 | Zadesky | B32B 17/10018 52/204.62 |
| 2009/0061145 A1* | 3/2009 | Lin | B29C 45/1671 428/67 |
| 2009/0128912 A1 | 5/2009 | Okada | |
| 2009/0181194 A1* | 7/2009 | Zhang | H04M 1/026 428/35.7 |
| 2009/0244025 A1* | 10/2009 | Hirota | G06F 1/1626 345/173 |
| 2009/0244508 A1* | 10/2009 | Schoeppach | B23K 1/0056 355/67 |
| 2009/0252978 A1* | 10/2009 | Katayama | B29C 65/44 428/457 |
| 2009/0297403 A1* | 12/2009 | Franke | B01J 19/0093 422/400 |
| 2010/0014232 A1* | 1/2010 | Nishimura | B29C 45/14073 361/679.3 |
| 2010/0048257 A1* | 2/2010 | Prest | B29C 45/14639 455/575.1 |
| 2010/0061040 A1* | 3/2010 | Dabov | G06F 1/1626 361/679.01 |
| 2010/0252185 A1 | 10/2010 | Kiuchi et al. | |
| 2010/0279491 A1 | 11/2010 | Kiuchi et al. | |
| 2011/0019123 A1* | 1/2011 | Prest | C03C 19/00 349/58 |
| 2011/0050053 A1* | 3/2011 | Deng | H04M 1/0266 312/223.1 |
| 2011/0110213 A1* | 5/2011 | Arai | G11B 7/1374 369/100 |
| 2011/0111176 A1* | 5/2011 | Chiu | B32B 3/02 428/157 |
| 2011/0139353 A1* | 6/2011 | Sugiyama | B29C 65/1635 156/212 |
| 2011/0188180 A1* | 8/2011 | Pakula | G06F 1/1626 361/679.01 |
| 2011/0215685 A1* | 9/2011 | Jarvis | B32B 37/16 312/223.1 |
| 2011/0267288 A1* | 11/2011 | Jeon | G06F 3/0412 345/173 |
| 2012/0031665 A1* | 2/2012 | Dai | H04M 1/026 174/561 |
| 2012/0099259 A1 | 4/2012 | Park | |
| 2012/0147532 A1* | 6/2012 | Yuan | G06F 1/1626 361/679.01 |
| 2012/0244343 A1* | 9/2012 | Stiehl | C09J 5/06 428/332 |
| 2012/0329525 A1* | 12/2012 | Hashimoto | C03C 15/00 455/566 |
| 2013/0034676 A1 | 2/2013 | Casebolt | |
| 2013/0034727 A1 | 2/2013 | Casebolt | |
| 2013/0050966 A1* | 2/2013 | Frenzel | B29C 66/9292 361/759 |
| 2013/0162891 A1 | 6/2013 | Wang | |
| 2013/0177302 A1* | 7/2013 | Weber | G06F 1/1626 396/155 |
| 2013/0236699 A1* | 9/2013 | Prest | B32B 9/002 428/157 |
| 2014/0023430 A1* | 1/2014 | Prest | B29C 47/0019 403/265 |
| 2014/0028902 A1* | 1/2014 | Sanford | H04N 5/2256 348/373 |
| 2014/0030443 A1* | 1/2014 | Prest | B41M 5/24 427/555 |
| 2014/0072794 A1 | 3/2014 | Rundle et al. | |
| 2014/0113116 A1* | 4/2014 | Vienonen | B32B 7/12 428/203 |
| 2014/0119042 A1* | 5/2014 | Sagesaka | F21S 48/2206 362/546 |
| 2014/0139978 A1 | 5/2014 | Kwong | |
| 2014/0192467 A1 | 7/2014 | Kwong | |
| 2014/0198436 A1* | 7/2014 | Lim | H04M 1/0266 361/679.01 |
| 2014/0216914 A1 | 8/2014 | Pope et al. | |
| 2014/0332157 A1* | 11/2014 | Arai | B29C 66/242 156/272.8 |
| 2014/0364811 A1* | 12/2014 | Holtwick | A61M 5/20 604/187 |
| 2015/0197074 A1* | 7/2015 | Takahashi | B32B 27/08 428/172 |
| 2015/0208539 A1* | 7/2015 | Blunier | H01L 23/08 312/223.1 |
| 2016/0066448 A1 | 3/2016 | Nazzaro et al. | |
| 2017/0095971 A1* | 4/2017 | Pullini | B23K 26/362 |

FOREIGN PATENT DOCUMENTS

| | | | |
|---|---|---|---|
| CN | 101088961 | 12/2007 | |
| CN | 101634186 | 1/2010 | |
| CN | 101693629 | 4/2010 | |
| CN | 101815594 | 8/2010 | |
| CN | 201804749 | 4/2011 | |
| CN | 102089898 | 6/2011 | |
| CN | 102528276 | 7/2012 | |
| DE | 4432081 A1 * | 3/1996 | ............ B29C 65/16 |
| DE | 10027073 C1 * | 8/2001 | ......... B29C 65/1635 |
| DE | WO 2005017429 A1 * | 2/2005 | ......... B29C 65/1412 |
| EP | 1270183 | 11/2003 | |
| EP | 1837831 A2 * | 9/2007 | ......... B29C 65/1635 |
| JP | 56005363 A * | 1/1981 | |
| JP | 56164040 A * | 12/1981 | |
| JP | 57108688 A * | 7/1982 | ........... G04D 3/0069 |
| JP | 60080784 A * | 5/1985 | ........... G04B 39/025 |
| JP | 60247486 A * | 12/1985 | ......... B23K 26/206 |
| JP | 61077786 A * | 4/1986 | ........... G04D 3/0097 |
| JP | 61294385 A * | 12/1986 | ........... G04B 39/025 |
| JP | 62064528 A * | 3/1987 | ......... B29C 37/0085 |
| JP | 62071626 A * | 4/1987 | ............ B29C 65/16 |
| JP | 08051285 A * | 2/1996 | |
| JP | 8213928 | 8/1996 | |
| JP | 2001071384 A * | 3/2001 | ......... B29C 65/1635 |
| JP | 2003253228 | 9/2003 | |
| JP | 2003320585 | 11/2003 | |
| JP | 2003320585 A * | 11/2003 | ............ B29C 65/16 |
| JP | 2004333946 A * | 11/2004 | ......... B29C 65/1664 |
| JP | 2004354438 A * | 12/2004 | |
| JP | 2005104092 A * | 4/2005 | ........... B29C 66/112 |
| JP | 2005297225 A * | 10/2005 | ......... B29C 65/1696 |
| JP | 2005300621 A * | 10/2005 | ......... B29C 65/1632 |
| JP | 2006141152 | 6/2006 | |
| JP | 2006341515 A * | 12/2006 | |
| JP | 2008052134 A * | 3/2008 | ......... B29C 65/1635 |
| JP | 2008284782 A * | 11/2008 | ......... B29C 65/1635 |
| JP | 2009226643 A * | 10/2009 | ......... B29C 65/1635 |
| JP | 2010274279 A * | 12/2010 | ......... B29C 65/1635 |
| JP | 2011122458 A * | 6/2011 | ........... B29C 66/112 |
| JP | 2011207056 A * | 10/2011 | |
| JP | 201495515 | 5/2014 | |
| JP | 2015093456 A * | 5/2015 | ......... B29C 65/1635 |

(56) References Cited

FOREIGN PATENT DOCUMENTS

| TW | 200307310 | 11/2004 | | |
|---|---|---|---|---|
| TW | 200812807 | 3/2008 | | |
| TW | 200915869 | 4/2009 | | |
| TW | 201214238 | 4/2012 | | |
| WO | WO2006/048500 | 5/2006 | | |
| WO | WO 2006048500 A1 * | 5/2006 | ............ | B23K 26/03 |
| WO | WO 2006090003 A1 * | 8/2006 | ............ | B29D 11/00 |

OTHER PUBLICATIONS

Machine Translation of JP 56005363 A, Jan. 1981.*
Machine Translation of JP 2011207056 A, Oct. 2011.*
Machine Translation of WO 2005017429 A1, Feb. 2005.*
Machine Translation of JP 2006341515 A, Dec. 2006.*
"Laserstrahlschweissen von Thermoplasten im Durchstrahlverfahren," Technische Information Fuer Experten, pp. 1-8, Feb. 1, 2000.

* cited by examiner

LASER WELDING OF TRANSPARENT AND OPAQUE MATERIALS

TECHNICAL FIELD

The disclosure relates generally to electronic devices, and more particularly to transparent materials included in electronic devices and methods for securing transparent materials in electronic devices.

BACKGROUND

Conventional electronic devices typically include a plurality of working or functional components all included within a single housing or casing. These components allow a user to interact with the electronic device. Some components of the electronic device include, for example, buttons, switches, screen displays and cameras. Each of these components may include portions that are visible or exposed on an outer surface of the electronic device, and may interact or may be in communication with portions of the component located within the electronic device. For example, the button may include a contact portion positioned on the outer surface of the electronic device, and may be in communication with internal portions that may interact with the electronic device and/or distinct components (e.g., processor) of the electronic device. In another example, a display and/or camera may include transparent windows that protect the components, but allow the components to be seen/be exposed to the exterior of the electronic device.

The components of the electronic device that are visible or exposed on an outer surface of the electronic device are typically coupled directly to the housing or include windows coupled directly to the housing. For example, the button may include a casing portion that is directly coupled to the housing, and the camera may include a window, positioned adjacent a camera lens, coupled directly to the housing. The components of the electronic device are typically coupled to the housing using an adhesive. More specifically, an adhesive is typically dispensed between the component and the housing to couple the component to the housing of the electronic device, and/or maintain the component within the housing during the operational life of the electronic device.

The reliance on adhesive alone to couple the components to the housing of the electronic device may cause operational issues. For example, over the operational life of the electronic device, the adhesive may wear or weaken. This may cause the component (e.g., button) or portions of the component (e.g., camera window) to become displaced or uncoupled from the housing of the electronic device. When the components become displaced or uncoupled from the housing, the electronic device may not function as intended or may not function at all.

In addition, the reliance on adhesive alone to couple the components to the housing of the electronic device may cause manufacturing issues. That is, when using adhesive to couple the components to the housing, it is typically required that the contact surfaces be treated in order to ensure adequate contact. More specifically, the contact surfaces of the component and the portion of the housing receiving the component may be planed, polished, and/or resurfaced in order to provide substantially flat contact surfaces free of defects formed during prior processing of the component (e.g., cutting, shaping). The treatment step of the contact surfaces adds time to the process of manufacturing the electronic device, especially, when the contact surfaces need to be treated multiple times and/or undergo multiple treatment processes.

These defects may be reduced, or eliminated, by providing additional cutting or shaping processes during the manufacturing of the components. However, these additional cutting or shaping processes tend to add time to the overall manufacturing process and, dependent on the material of the component, can increase cost as well. For example, where the component is made from corundum, commonly referred to as sapphire, additional cutting processes can be performed on the component to minimize the defects on the contact surface. However, because of sapphires hardness (e.g., 9.0 Mohs hardness scale), cutting the material can be difficult, time consuming and can result in rapid wear to the cutting tool. This rapid wear to the cutting tool may result in constant replacement and/or sharpening of the cutting tool during the manufacturing process.

The inclusion of adhesive to couple to the components to the housing of the electronic device may increase the cost of manufacturing based on the amount of adhesive used and/or the number of components that utilize adhesive within the electronic device. That is, the adhesive itself adds an additional component to the electronic device, which also increases the cost to manufacture the electronic device, and increases the manufacture time by the amount of time it takes to apply the adhesive to the component and/or the housing of the electronic device.

Additionally, the inclusion of adhesive to couple the components to the housing of the electronic device may require further processes in order to meet cosmetic requirements for the electronic device. For example, after adhesive is applied to couple components of the electronic device, a decorative ink may be applied to the electronic device to hide the adhesive between the components. That is, a decorative ink may be applied to a surface and/or component of the electronic device to substantially hide the adhesive, which may not be aesthetically or visually appealing. Similar to the adhesive above, the application of the decorative ink on an electronic device may increase the manufacturing time of the electronic device, as well as, increase the cost of manufacturing the electronic device.

SUMMARY

Generally, embodiments discussed herein are related to apparatuses including transparent materials, transparent materials used in electronic devices and methods for securing transparent materials in electronic devices. The apparatuses and electronic devices typically include two components: a first component (e.g., enclosure) having an aperture, and a second component which includes the transparent material. The second component is positioned within the aperture of the first component and is laser welded directly to the first component. More specifically, a laser is positioned above the first and second component and emits a beam through the second component, including the transparent material, to the first component to form a laser weld between the respective components. By welding the first component to the second component, the need for an adhesive to bind the components is unnecessary, and a substantially permanent coupling may be formed between the components. Additionally, in some embodiments, by forming the laser weld between the first and second component by emitting a laser beam through the second component, the weld may be substantially hidden from the user of the electronic device. That is, by laser welding the respective components, the weld may be substantial undetectable by, or concealed from, the user of the electronic device. Not only will the laser weld improve the coupling strength between the first and second component, but it may also improve the cosmetic features of the electronic device.

One embodiment may include an apparatus. The apparatus may include a first component including an aperture, and a second component including a transparent material. The second component may be positioned within the aperture of the first component. Additionally, the second component may be welded to the first component.

Another embodiment may include an electronic device. The electronic device may include an enclosure. The enclosure of the electronic device may include at least one aperture formed through a portion of the enclosure. Additionally, the electronic device may include a component positioned within the at least one aperture formed through the portion of the enclosure. The component may be laser welded to the at least one aperture formed through the portion of the enclosure. Furthermore, the component may include a transparent material.

A further embodiment may include a method for securing a component within an electronic device enclosure. The method may include providing an electronic device enclosure. The electronic device enclosure may include at least one aperture. The method may also include positioning a component within the at least one aperture formed through the enclosure, and welding the component to the enclosure. The component may include a transparent material.

BRIEF DESCRIPTION OF THE DRAWINGS

The disclosure will be readily understood by the following detailed description in conjunction with the accompanying drawings, wherein like reference numerals designate like structural elements, and in which.

Figure 1A:
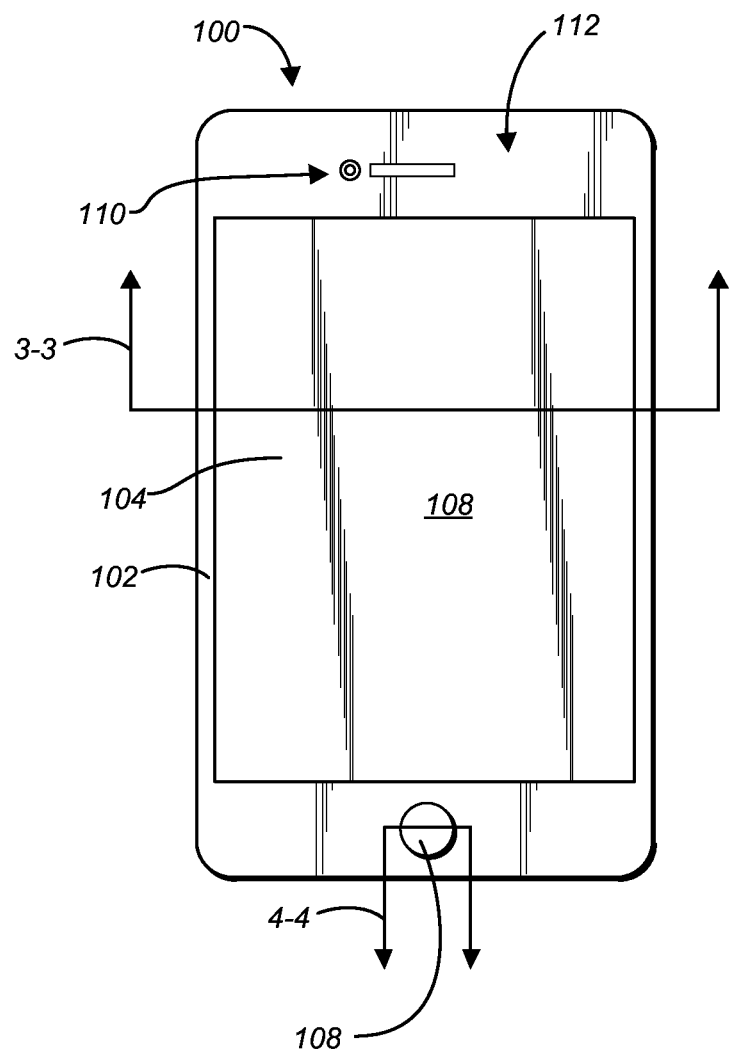
FIG. 1A shows an illustrative front view of an electronic device, according to embodiments.

It is noted that the drawings of the invention are not necessarily to scale. The drawings are intended to depict only typical aspects of the invention, and therefore should not be considered as limiting the scope of the invention. In the drawings, like numbering represents like elements between the drawings.

DETAILED DESCRIPTION

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims.

The following disclosure relates generally to electronic devices, and more particularly, to transparent materials included in electronic devices and methods for securing transparent materials in electronic devices.

Discussed herein are apparatuses including transparent materials, transparent materials used in electronic devices and methods for securing transparent materials in electronic devices. The apparatuses and electronic devices typically include two components: a first component (one example of which is an enclosure) having an aperture; and a second component which includes the transparent material. The second component is positioned within the aperture of the first component and is laser welded directly to the first component.

More specifically, a laser is positioned above the first and second component and emits a beam through the second component, including the transparent material, to the first component to form a laser weld between the respective components. By welding the first component to the second component, the need for an adhesive to bind the components may be unnecessary, and a substantially permanent coupling may be formed between the components. Additionally, in some embodiments, by forming the laser weld between the first and second component by emitting a laser beam through the second component, the weld may be substantially hidden from the user of the electronic device. That is, by laser welding the respective components, the weld may be substantially undetectable by, or concealed from, the user of the electronic device. Not only may the laser weld improve the coupling strength between the first and second component, but it may also improve the cosmetic features of the electronic device.

These and other embodiments are discussed below with reference to FIGS. 1A-6D. However, those skilled in the art will readily appreciate that the detailed description given herein with respect to these Figures is for explanatory purposes only and should not be construed as limiting.

Figure 1B:
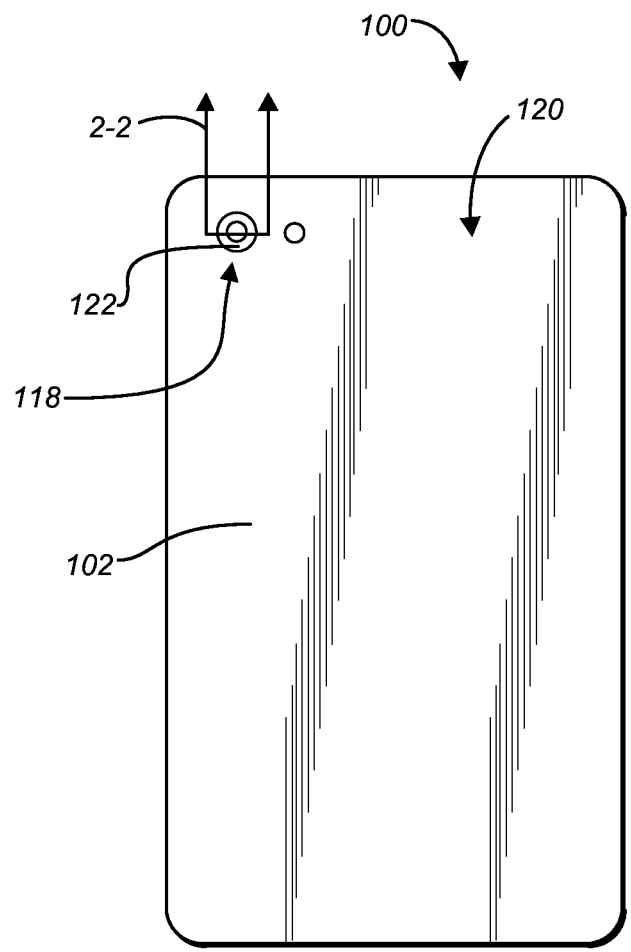
FIG. 1B shows an illustrative back view of the electronic device of FIG. 1A, according to embodiments.

FIGS. 1A and 1B show an illustrative front and back view, respectively, of an electronic device 100, according to embodiments. In the illustrated embodiment, electronic device 100 is implemented as a mobile phone. Electronic device 100 may include, or may be connected to a biometric sensing device (not shown). Other embodiments can implement the electronic device 100 differently, such as, for example, as a laptop or desktop computer, a tablet computing device, a gaming device, a display, a digital music player, a wearable computing device or display such as a watch or glasses, and other types of electronic devices that can receive biometric data from a biometric sensing device.

Electronic device 100 may include an enclosure 102 at least partially surrounding a display 104 and one or more buttons 106 or input devices. The enclosure 102 may form an outer surface or partial outer surface and protective case for the internal components of the electronic device 100, and may at least partially surround the display 104. The enclosure 102 may be formed of one or more components operably connected together, such as a front piece and a back piece. In a non-limiting example, where enclosure 102 may be formed from a plurality of components, enclosure 102 may include a trim piece that may be coupled to additional components configured to be operably connected to form a protective case for electronic device 100, as discussed herein. Alternatively, the enclosure 102 may be formed of a single piece operably connected to the display 104. Enclosure 102 may include a plurality of distinct materials including, but not limited to: corundum, commonly referred to as sapphire, metal, glass or plastic. Additionally, enclosure 102 may include a decorative and/or coating layer that be disposed on the outer and/or or inner surface of enclosure 102. The decorative layer and/or coating layer may be disposed on the surface(s) of enclosure 102 to protect the enclosure and/or provide a decorative feature (e.g., exterior color) for electronic device 100.

Display 104 may be implemented with any suitable technology, including, but not limited to, a multi-touch sensing touchscreen that uses liquid crystal display (LCD) technology, light emitting diode (LED) technology, organic light-emitting display (OLED) technology, organic electroluminescence (OEL) technology, or another type of display technology. Display 104 may include a substantially transparent layer 108 positioned above the touchscreen. That is, and as discussed herein, transparent layer 108 may be positioned above the touchscreen of display 104 and may be positioned within an aperture of enclosure 102, such that enclosure 102 and transparent layer 108 are in planar alignment with front surface 112 of electronic device 100. Transparent layer 108 may protect display 104 from containments, without obstructing a user's view and/or ability to interact with display 104 and/or electronic device 100. Transparent layer 108 may be formed from a variety of substantially transparent materials including, but not limited to: sapphire, glass or plastic.

Button 106 may include any conventional input/output (I/O) device for electronic device 100. Specifically, button 106 may include an actuation component (see, FIG. 4) in electronic and/or mechanical communication with the internal components of electronic device 100, to provide user input and/or allow the user to interact with the various functions of electronic device 100. In an embodiment button 106 may be configured as a single component surrounded by enclosure 102. Alternatively, button 106 may include a plurality of components, including an actuation component, in mechanical/electrical communication with one another and/or internal component of electronic device 100. Button 106 may be formed from a transparent material, similar to transparent layer 108. That is, at least a portion of button 106 may be formed from a substantially transparent material including, but not limited to: sapphire, glass or plastic.

As shown in FIGS. 1A and 1B, electronic device 100 may also include a plurality of camera systems. More specifically, electronic device 100 may include a first camera system 110 positioned on the front surface 112 of electronic device 100 (see, FIG. 1A) and a second camera system 118 positioned on the back surface 120 of electronic device 100 (see, FIG. 1B). Similar to display 104 of electronic device 100, first camera system 110 and second camera system 118 may include a transparent layer positioned within enclosure 102. In an non-limiting example as shown in FIG. 1B, second camera system 118 may include a window 122 that may be positioned in front of the internal components of second camera system 118 and may be positioned within enclosure 102. As discussed herein, window 122 of second camera system 118 may be positioned within an aperture of enclosure 102, such that enclosure 102 and window 122 are in planar alignment with back surface 120 of electronic device 100. Also similar to transparent layer 108 of display 104, window 122 may be formed from a plurality of substantially transparent materials including, but not limited to: sapphire, glass, or plastic. Window 122 may be configured to provide a transparent protective layer for second camera system 118 that may protect second camera system 118 from contaminants, without obstructing electronic device's 100 ability to take images and/or videos using second camera system 118.

Figure 2A:
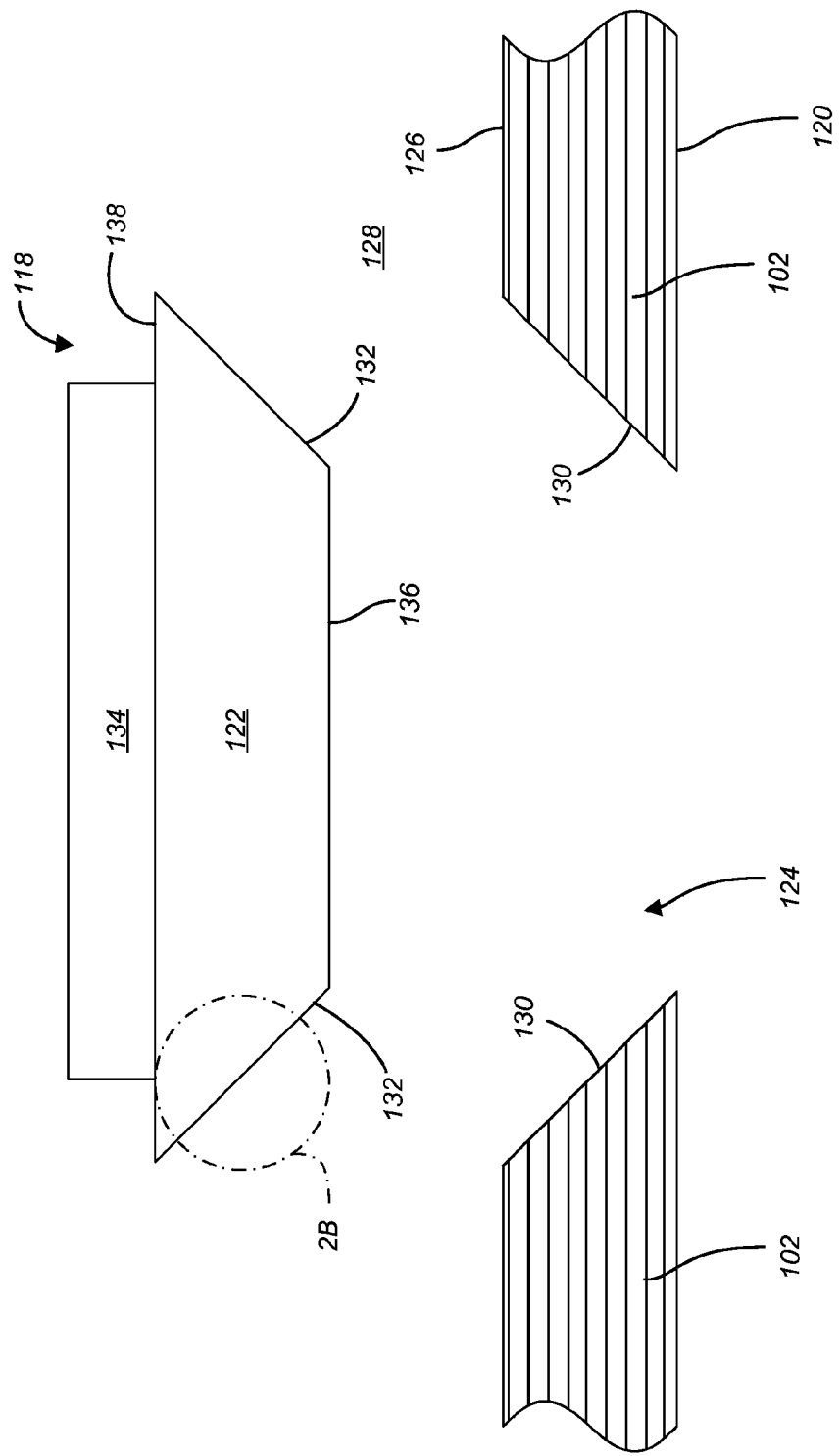
FIG. 2A shows an exploded, front cross-section view of a portion of electronic device of FIG. 1B taken along line 2-2 of FIG. 1B, according to embodiments.

FIG. 2A shows an exploded, simplified cross-section view of a portion of electronic device 100 along line 2-2 in FIG. 1B. More specifically, FIG. 2A shows an exploded, simplified cross-section view of enclosure 102 and second camera system 118 including window 122 of electronic device 100. Enclosure 102 of electronic device 100 may include a plurality of distinct apertures formed therein or therethrough. Each of the plurality of apertures may be configured to receive a distinct component (e.g., window 122, transparent layer 108 of display 104, button 106) of electronic device 100.

As shown in FIG. 2A, and as discussed herein, aperture 124 formed through enclosure 102 may be configured to receive window 122 of second camera system 118. Aperture 124 may be formed through the body of enclosure 102 and may form a passageway between an exposed or exterior surface (e.g., back surface 120) and an interior surface 126 of enclosure 102. As shown in FIG. 2A, the exterior surface may include back surface 120 of electronic device 100, and interior surface 126 may include a surface positioned within enclosure 102 and/or between back surface 120 and front surface 112 (see, FIG. 1A) of electronic device 100. Interior surface 126 may be positioned adjacent an internal cavity 128 of electronic device 100, which may house the internal components of electronic device 100.

The plurality of apertures (e.g., aperture 124) of enclosure 102 may be configured to receive a component or components (such as, window 122, transparent layer 108 of display 104, button 106) of electronic device 100 by having a complementary shape of the component, which includes any shape configured to accept and/or retain such a component. As discussed herein, by including complementary shapes, the component of electronic device 100 positioned within the aperture of enclosure 102 may also be adequately coupled (e.g., welded) to enclosure 102 of electronic device 100.

Figure 2B:
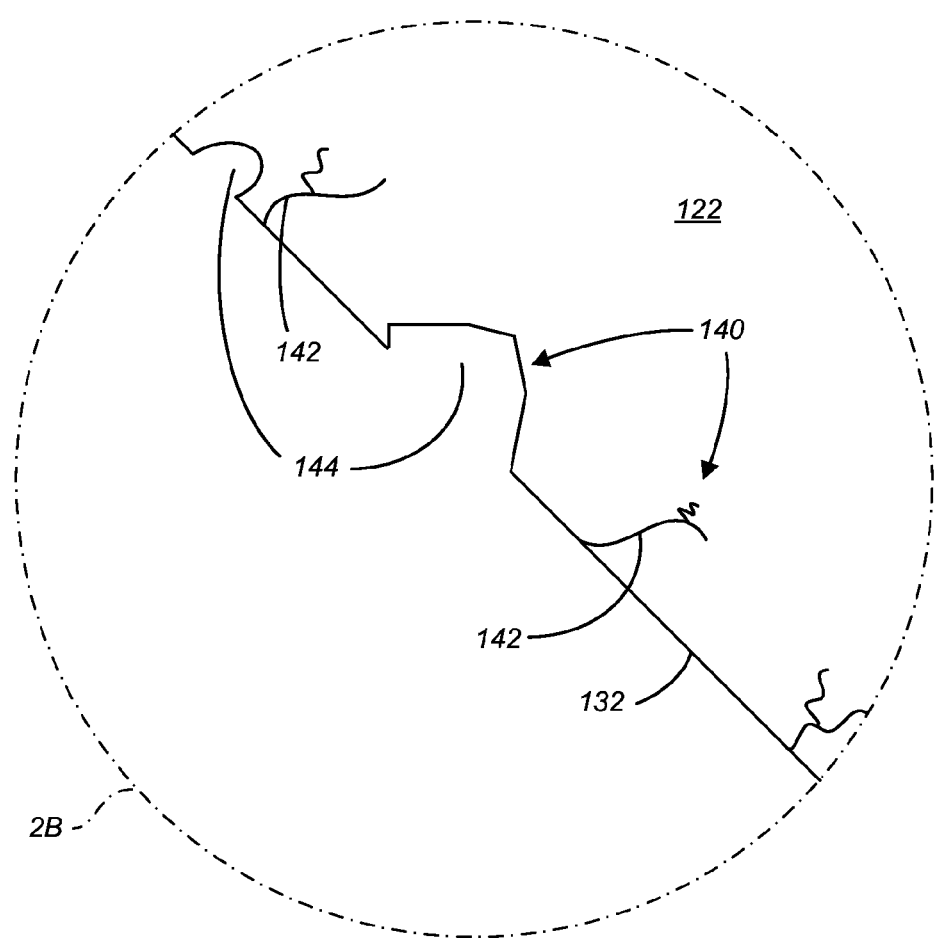
FIG. 2B shows an enlarged portion of a window of electronic device as depicted in FIG. 2A, according to embodiments.

In an non-limiting example, as shown in FIGS. 2A and 2B, aperture 124 of enclosure 102 may include angled sidewalls 130 that may be complementary to the sidewalls 132 of window 122. More specifically, sidewalls 130 of aperture 124 in enclosure 102 may include an angle substantially equal to the angle of sidewalls 132 of window 122 of second camera system 118. By having sidewalls that complement the angle and shape of the sidewalls of the window 122 may be positioned within aperture 124 of enclosure 102, and sidewalls 130 of aperture 124 and sidewalls 132 of window 122 may substantially contact one another.

Second camera system 118 may include internal camera components 134 positioned adjacent window 122. Internal camera components 134 may be positioned within internal cavity 128 of electronic device 100, adjacent interior surface 126 of enclosure 102. As shown in FIG. 2A, internal camera components 134 may include any conventional component(s) used in second camera system 118, including a lens, a magnifier, a shutter, diaphragm, etc. Additional explanation of these components is omitted herein for clarity.

Window 122 of second camera system 118 may include a first surface 136 and a second surface 138 positioned opposite first surface 136. As discussed herein, when window 122 is positioned within enclosure 102, first surface 136 may be an external surface and may be substantially exposed to the exterior of electronic device 100 and/or may be in planar alignment with the exterior surface or back surface 120 of electronic device 100. Furthermore, and as discussed herein, when window 122 is positioned within enclosure 102, second surface 138 may include an internal surface positioned adjacent interior surface 126 of enclosure 102 and/or may be positioned within cavity 128 of electronic device 100.

First surface 136 and second surface 138 of window 122 may include surface treatments. More specifically, prior to, or subsequent to, positioning window 122 within enclosure 102, first surface 136 and second surface 138 may undergo surface treatment processes including, but not limited to: lapping, planing, grinding, or polishing. In a non-limiting example, first surface 136 and second surface 138 may be polished prior to positioning window 122 within enclosure 102 to substantially ensure that window 122 includes an acceptable transparency that will not obstruct second camera system 118. The surface treatment processes may be performed on window 122 prior to and/or subsequent to the forming (e.g., cutting, shaping) of window 122.

As shown in FIG. 2A, sidewalls 132 of window 122 may be positioned between treated first surface 136 and treated second surface 138, and may be substantially angled, as discussed herein. Unlike treated first surface 136 and treated second surface 138, sidewalls 132 of window 122 may not be treated. That is, sidewalls 132 of window 122 may not undergo surface treatment processes prior to window 122 being positioned within aperture 124 of enclosure 102.

As a result of not performing surface treatment processes on sidewalls 132, untreated sidewalls 132 of window 122 may include defects 140. FIG. 2B, shows an enlarged portion of sidewalls 132 of window 122 as depicted in FIG. 2A. As shown in FIG. 2B, defects 140 may be formed on the surface of sidewalls 132 of window 122 as a result of the forming processes (e.g., cutting, shaping) utilized when forming window 122. In a non-limiting example, window 122 may be formed from a transparent, sapphire material. More specifically, window 122 may be formed by cutting window 122 from a large sheet of sapphire material. Because sapphire is hard and brittle, the cutting process used to form window 122 may create defects 140 on one or more of the various surfaces (e.g., sidewalls 132, first surface 136, second surface 138) of the sapphire. Surface treatment processes performed on first surface 136 and second surface 138 may remove these defects 140 formed on the respective surfaces. However, untreated sidewalls 132 of window 122 may maintain defects 140 when positioned within aperture 124 of enclosure 102. As shown in FIG. 2B, defects 140 of sidewalls 132 may include a plurality of cracks 142 and/or depressions 144. As discussed herein, defects 140 may not negatively affect the coupling between window 122 and enclosure 102.

Figure 2C:
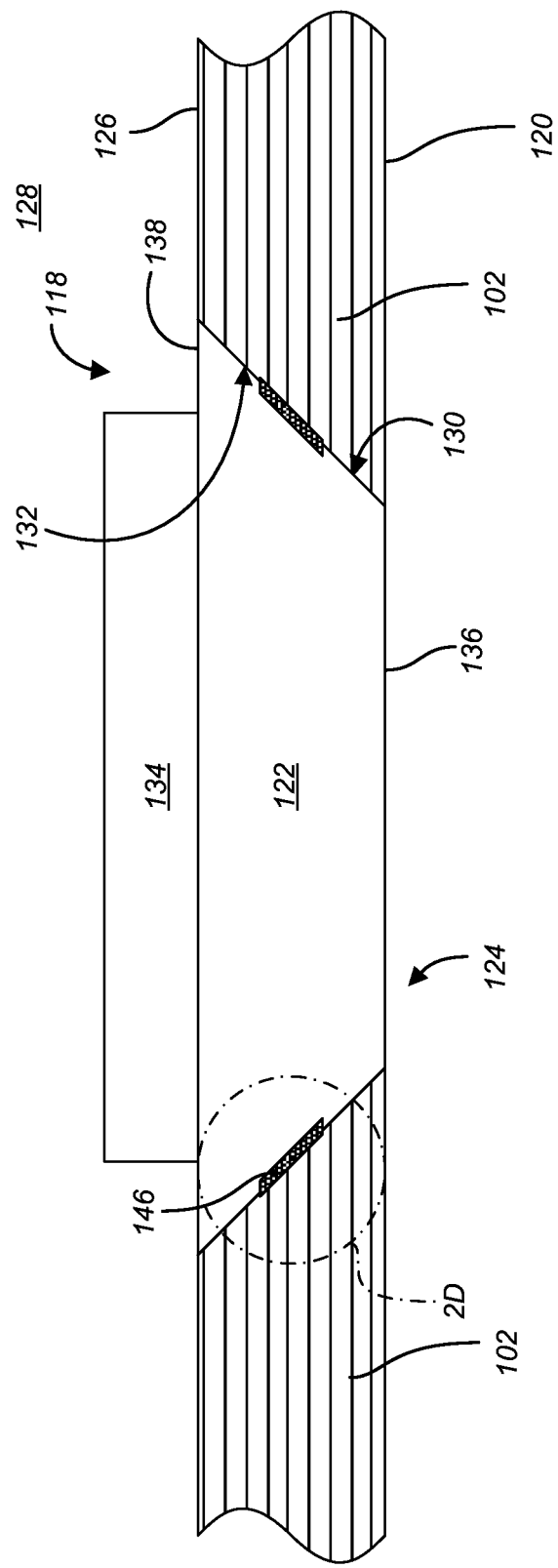
FIG. 2C shows a front cross-section view of a portion of electronic device of FIG. 1B taken along line 2-2, according to embodiments.

FIG. 2C shows a cross-section view of window 122 of second camera system 118 positioned within aperture 124 of enclosure 102. As discussed herein, aperture 124 of enclosure 102 may include a complementary shape (e.g., angled sidewalls 130) for receiving window 122. Window 122 may be positioned within aperture 124 such that treated first surface 136 or external surface of window 122 may be in planar alignment with exterior surface or back surface 120 of enclosure 102. That is, as shown in FIG. 2C, the exposed surfaces (e.g., treated first surface 136, back surface 120) of window 122 and enclosure 102 may be in planar alignment, such that treated first surface 136 of window 122 and back surface 120 of enclosure 102 form a continuous, smooth surface.

Window 122 may also be coupled to enclosure 102. More specifically, as shown in FIG. 2C, window 122 may be welded to enclosure 102 and may be substantially fixed within aperture 124 of enclosure 102. As discussed herein, and as shown in FIG. 2C, enclosure 102 may include a protective casing for electronic device 100, where window 122 is welded to enclosure 102 forming the protective casing. In another non-limiting example, and as discussed herein, where enclosure 102 includes a plurality of components, and specifically where enclosure 102 includes a trim piece, window 122 may be welded to the trim piece forming enclosure 102.

In coupling window 122 to enclosure 102, a weld interface 146 may be present between sidewalls 130 of enclosure 102 and untreated sidewalls 132 of window 122 to couple the components of electronic device 100. As shown in FIG. 2C, weld interface 146 may be positioned between treated first surface 136 or external surface of window 122, and treated second surface 138 or internal surface of window 122. Additionally, weld interface 146 may be positioned between exterior surface or back surface 120 and interior surface 126 of enclosure 102. As shown in FIG. 2C, weld interface 146 may be formed around an entire perimeter of sidewalls 130 of aperture 124 and/or untreated sidewalls 132 of window 122 to ensure window 122 is substantially coupled or fixed to enclosure 102. Weld interface 146 may include a solidified molten pool or deposit of material forming enclosure 102, that may couple or weld enclosure 102 to window 122. As discussed herein, a portion of sidewall 130 of enclosure 102 may be exposed to a laser beam, which may create molten pool of a portion of material forming sidewalls 130 to weld enclosure 102 to window 122.

Figure 2D:
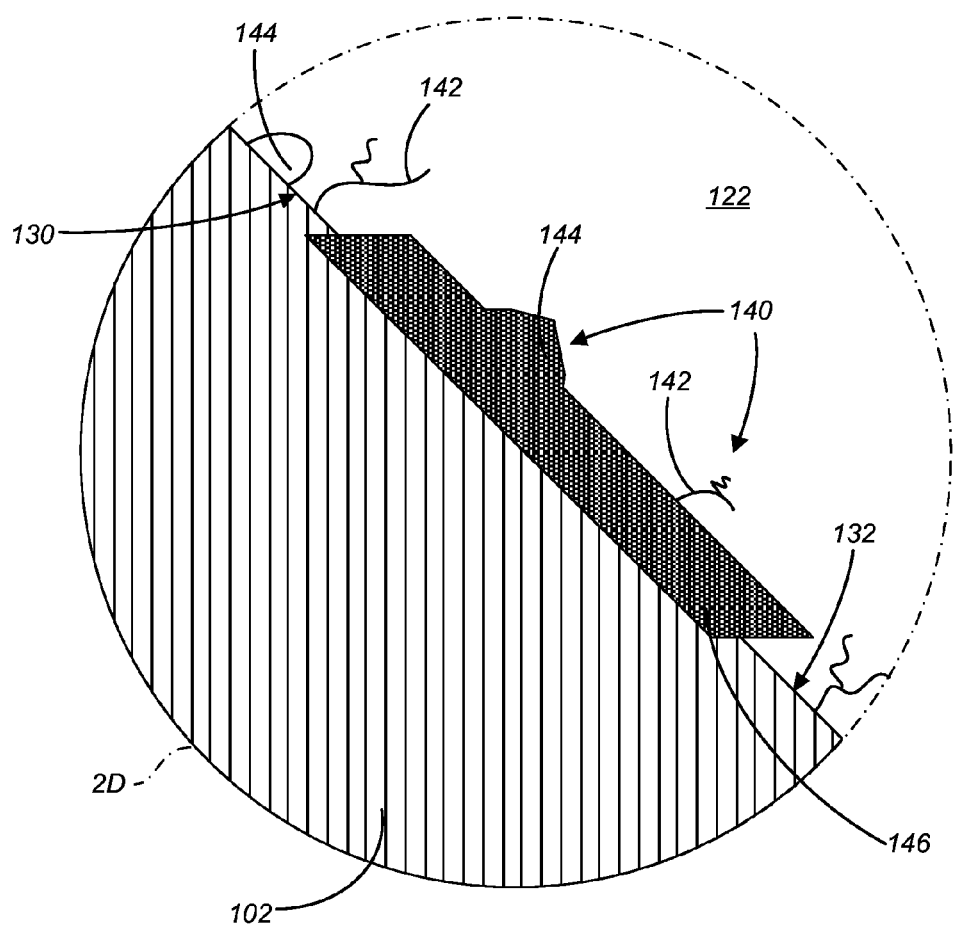
FIG. 2D shows an enlarged portion of a window and enclosure of electronic device as depicted in FIG. 2D, according to embodiments.

FIG. 2D shows an enlarged portion of weld interface 146 as depicted in FIG. 2C. As discussed herein, weld interface 146 may be formed between sidewalls 130 of enclosure 102 and untreated sidewalls 132 of window 122 from a solidified molten pool of material forming enclosure 102. As a result of the weld being formed from the solidified molten pool of material forming enclosure 102, weld interface 146 may also be formed within defects 140 of untreated sidewalls 132 of window 122. More specifically, as shown in FIG. 2D, weld interface 146 may be formed within cracks 142 and/or depressions 144 previously formed within untreated sidewalls 132 of window 122 when forming (e.g., cutting) window 122. By forming weld interface 146 within defects 140 of untreated sidewall 132 of window 122, weld interface 146 may completely contact the entire surface of sidewall 130 to fix window 122 to enclosure 102. Additionally, potential issues with defects 140 may be substantially minimized when forming weld interface 146 within defects 140 of untreated sidewall 132 of window 122. In a non-limiting example, depression 144 formed in untreated sidewalls 132 of window 122 may substantially increases the chance of window 122 being split during an undesirable impact event (e.g., dropping electronic device 100). However, weld interface 146 may fill depression 144 formed in untreated sidewalls 132 of window 122, and may provide additional structure support to window 122 and/or may provide a binding-effect within depression 144 to prevent further defect within window 122.

As a result of angled sidewalls 132 of window 122 and corresponding angled sidewalls 130 of enclosure 102, weld interface 146 may not be visible to a user of electronic device 100. More specifically, because the respective angled sidewalls for window 122 and enclosure 102 extend toward internal cavity 128 and/or enclosure 102, a user of electronic device 100 viewing back surface 120 may not be able to see weld interface 146. As such, a "hidden weld" may be formed to couple window 122 to enclosure 102 of electronic device 100.

Figure 3:
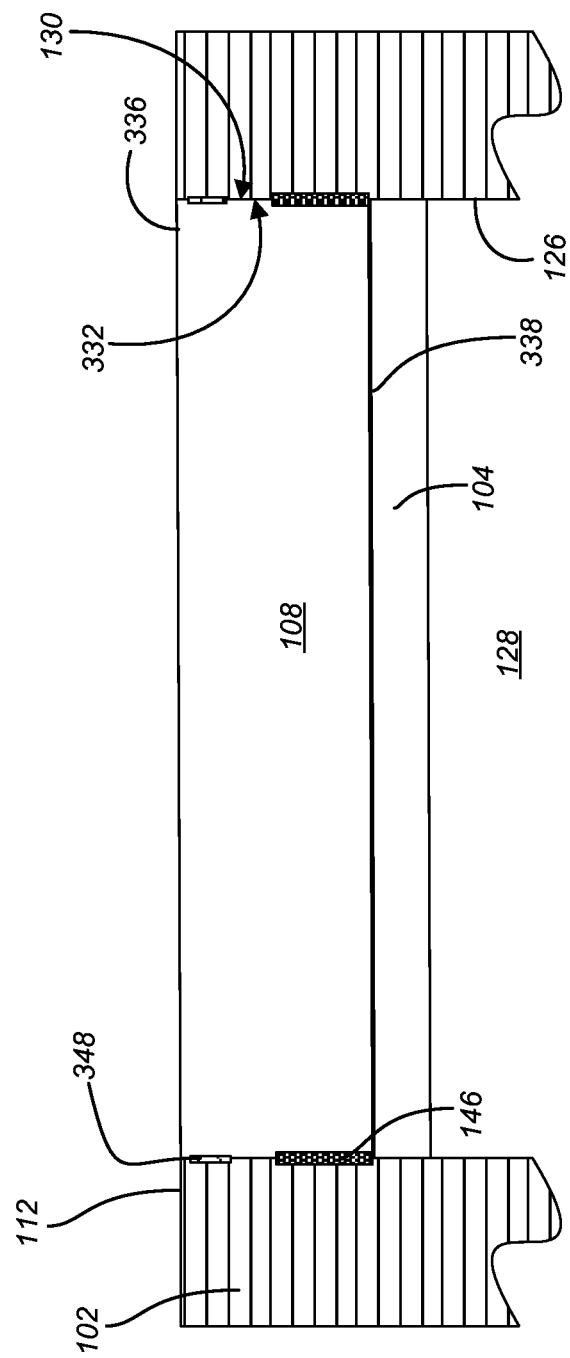
FIG. 3 shows a front cross-section view of a portion of electronic device of FIG. 1A taken along line 3-3 of FIG. 1A, according to embodiments.

FIG. 3 shows a front cross-section view of a portion of electronic device 100 along line 3-3 in FIG. 1A. More specifically, FIG. 3 shows a front cross-section view of transparent layer 108 of display 104 positioned within enclosure 102 in electronic device 100. It is understood that similarly named and/or numbered components may function in a substantially similar fashion. Redundant explanation of these components has been omitted for clarity.

Transparent layer 108 of electronic device 100 may include first surface 336, which may be exposed to a user. More specifically, as shown in FIG. 3, transparent layer 108 may be positioned within enclosure 102, such that first surface 336 of transparent layer 108 may be an external surface, and may be substantially exposed to the exterior of electronic device 100 and/or may be in planar alignment with the exterior surface or front surface 112 of electronic device 100. Additionally, when transparent layer 108 is positioned within aperture 324 of enclosure 102, the exposed surfaces (e.g., treated first surface 336, front surface 112) of transparent layer 108 and enclosure 102 may be in planar alignment, such that treated first surface 336 of transparent layer 108 and front surface 112 of enclosure 102 form a continuous, smooth surface.

As shown in FIG. 3, display 104, which may include a touchscreen, may be positioned on or adjacent to second surface 338 or internal surface of transparent layer 108 of electronic device 100. Additionally, display 104 may be positioned within internal cavity 128 and/or adjacent to interior surface 126 of enclosure 102. As discussed herein transparent layer 108 may be configured as a protective layer for display 104.

As similarly discussed herein with respect to window 122, first surface 336 and second surface 338 of transparent layer 108 may include a surface treatment. That is, first surface 226 and second surface 338 of transparent layer 108 may undergo surface treatment(s) prior to transparent layer 108 being positioned within aperture 324 of enclosure 102. To the contrary of treated first surface 336 and treated second surface 338, but similar to sidewalls 132 of window 122 in FIGS. 2A-2D, sidewalls 332 of transparent layer 108 may include untreated sidewalls 332. As a result, untreated sidewalls 332 of transparent layer 108 may include defects 140 as a result of forming (e.g., cutting) transparent layer 108 of electronic device 100.

Similar to window 122 shown in FIGS. 2A-2D, transparent layer 108 of electronic device 100, as shown in FIG. 3, may also be coupled or welded to enclosure 102. More specifically, transparent layer 108 may be fixed within aperture 324 of enclosure 102 via weld interface 146 present between sidewalls 130 of enclosure 102 and untreated sidewalls 332 of transparent layer 108. As shown in FIG. 3, and similarly discussed herein, weld interface 146 may be positioned between external or treated first surface 336 and internal or treated second surface 138 of transparent layer 108 and, exterior or front surface 112 and interior surface 126 of enclosure 102. Additionally, weld interface 146 may be formed around an entire perimeter of sidewalls 130 of aperture 324 and/or untreated sidewalls 332 of transparent layer 108 to ensure transparent layer 108 is substantially coupled or welded to enclosure 102. As discussed herein, weld interface 146 may include a solidified molten pool of material forming enclosure 102, that may couple or weld transparent layer 108 to enclosure 102.

As shown in FIG. 3, an adhesive 348 may be positioned in aperture 324 formed through enclosure 102 and transparent layer 108. That is, adhesive 348 may be positioned between sidewalls 130 of enclosure 102 and untreated sidewalls 332 of transparent layer 108, and may be positioned adjacent weld interface 146. Adhesive 348, as shown in FIG. 3 may also be positioned between positioned between external or treated first surface 336 and internal or treated second surface 138 of transparent layer 108, and exterior or front surface 112 and interior surface 126 of enclosure 102. In a non-limiting example, adhesive 348 may be positioned between weld interface 146 and external or treated first surface 336 of transparent layer 108 and/or exterior or front surface 112 of enclosure 102. Adhesive 348 may be formed between weld interface 146 and the external surfaces of transparent layer 108 and/or enclosure 102 for functional and/or cosmetic purposes. In a non-limiting example of functionality, adhesive 348 may be formed between enclosure 102 and transparent layer 108 to adhere and/or aid in the coupling of transparent layer 108 to enclosure 102. In a non-limiting example of cosmetic application, adhesive 348 may be formed between enclosure 102 and transparent layer 108 to hide weld interface 146. That is, adhesive 348 may be provided in electronic device 100 (see, FIG. 1A) to substantially prevent a user of electronic device 100 from seeing weld interface 146 formed between enclosure 102 and transparent layer 108, where weld interface 146 may not be "hidden" from a user due to the configuration or shape of the components (e.g., enclosure 102, transparent layer 108) of electronic device 100. Adhesive 348 formed in aperture 324 of enclosure 102 may be any conventional adhesive material capable of adhering transparent layer 108 to enclosure 102.

Although shown and discussed herein as being used with transparent layer 108, it is understood that adhesive 348 of FIG. 3 may be utilized with any component of electronic device 100 positioned in, and welded to, enclosure 102. That is, adhesive 348 may be utilized with window 122, as discussed herein with respect to FIGS. 2A-2D, and button 106, as discussed herein with respect to FIG. 4.

Figure 4:
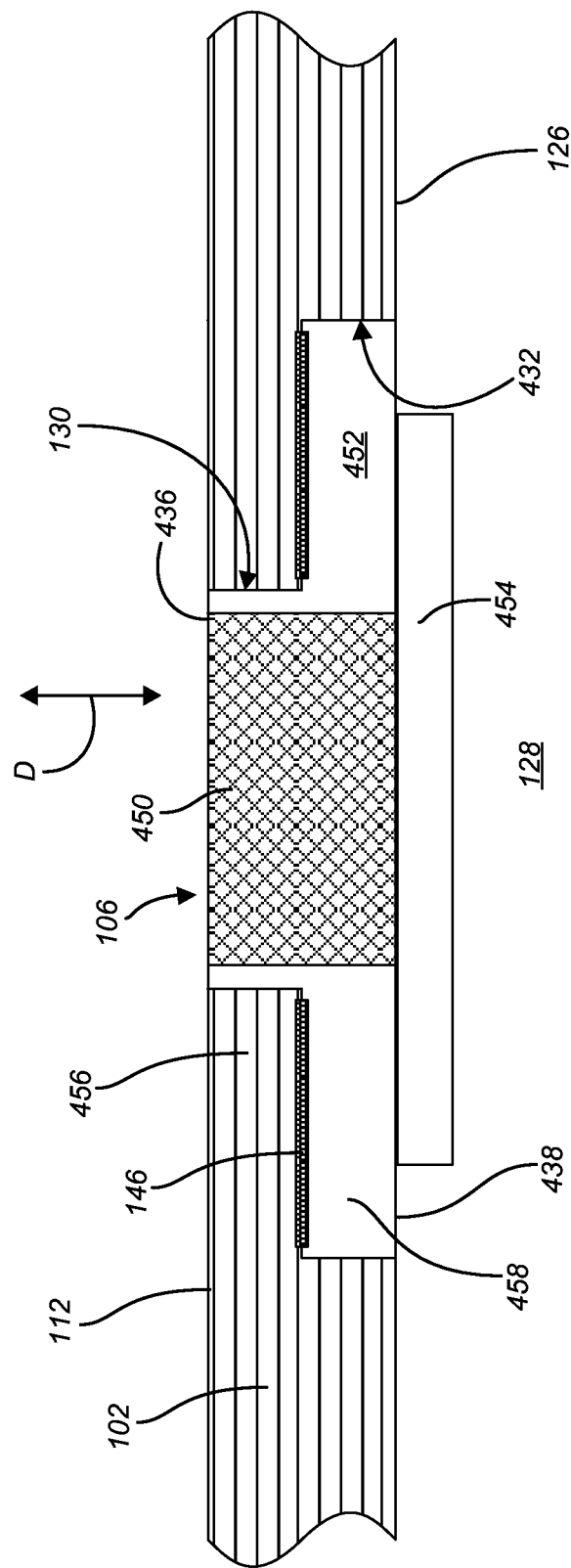
FIG. 4 shows a front cross-section view of a portion of electronic device of FIG. 1A taken along line 4-4 of FIG. 1A, according to embodiments.

FIG. 4 shows a front cross-section view of a portion of electronic device 100 along line 4-4 in FIG. 1A. More specifically, FIG. 4 shows a front cross-section view of button 106 positioned within enclosure 102 in electronic device 100. Button 106 may include a button housing 452 made from a substantially transparent material (e.g., sapphire, glass, plastic), and an actuation component 450 positioned within button housing 452 of button 106. Actuation component 450 may be configure to move within button housing 452 in a direction (D), while button housing 452 remains substantially stationary and/or welded to enclosure 102, as discussed herein. Additionally, actuation component 450 of button 106 may be in mechanical and/or electronic communication with an internal button component 454 of electronic device 100. In a non-limiting example, internal button component 454 may include a piezoelectric sensor that may be in electro-mechanical communication with actuation component 450. When actuation component 450 of button 106 is actuated by a user, actuation component 450 contacts and/or deforms the piezoelectric sensor to send an electronic signal to distinct, internal components of electronic device 100.

As shown in FIG. 4, enclosure 102 may include a bezel portion 456. More specifically, sidewalls 130 of enclosure 102 may include bezel portion 456, which may complement a protrusion portion 458 of button housing 452 of button 106. When button 106 includes protrusion portion 458, and enclosure 102 includes complementary bezel portion 456, weld interface 146 may be formed on and/or between protrusion portion 458 and bezel portion 456 to weld button 106 to enclosure 102. More specifically, as shown in FIG. 4, weld interface 146 may be formed between a portion of sidewalls 130 of bezel portion 456 of enclosure 102 and a portion of untreated sidewalls 432 of protrusion portion 458 of button 106 to weld button housing 452 of button 106 to enclosure 102. Weld interface 146 may be positioned between external or treated first surface 436 and internal or treated second surface 438 of button 106 and, exterior or front surface 112 and interior surface 126 of enclosure 102. Additionally, weld interface 146 may be formed around an entire perimeter of bezel portion 456 of enclosure 102 and/or protrusion portion 458 of button housing 452 to ensure button 106 is substantially coupled or welded to enclosure 102.

By providing weld interface 146 between protrusion portion 458 of button housing 452 and bezel portion 456 of enclosure 102, weld interface 146 may not be visible, or may be "hidden" from a user viewing front surface 112 of electronic device 100. More specifically, bezel portion 456 of enclosure 102 may be positioned on top of and/or may extend over protrusion portion 458 of button housing 452, such that protrusion portion 458 is not visible from front surface 112 of electronic device 100. As a result, weld interface 146 may also be covered and/or not visible from front surface 112 because of bezel portion 456.

Figure 5:
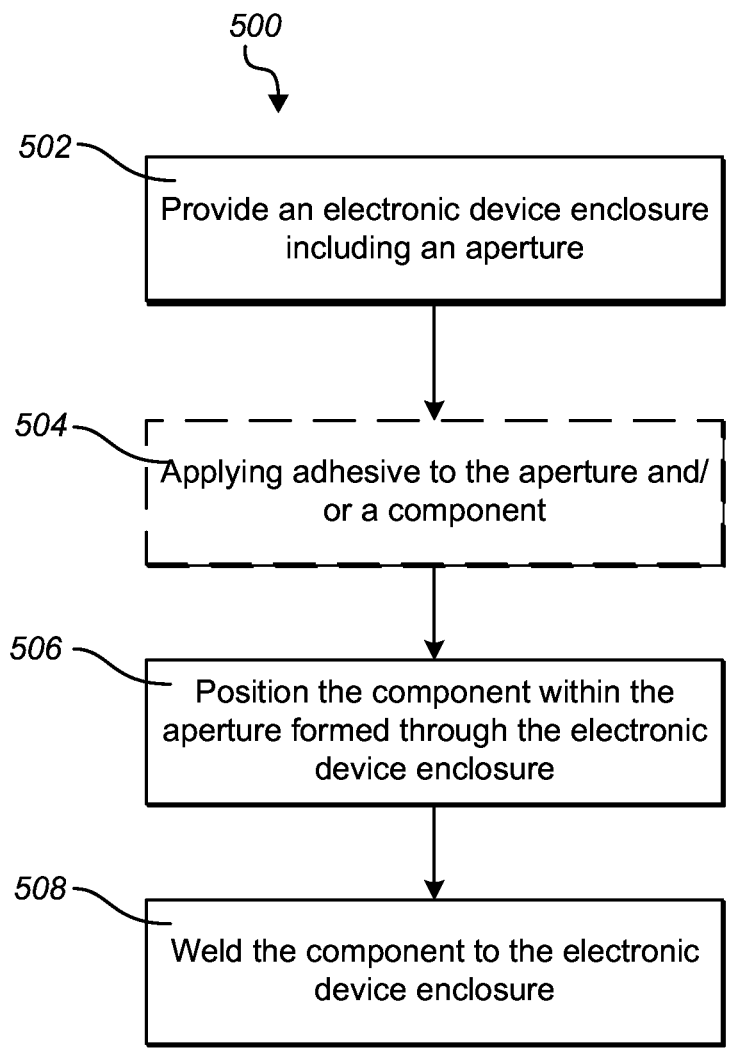
FIG. 5 shows a flow chart illustrating a method for securing a component within an electronic device enclosure.

Turning to FIG. 5, a method of securing a component within an electronic device enclosure (see, FIGS. 1A and 1B) is now discussed. Specifically, FIG. 5 is a flowchart depicting one sample method 500 for securing a component within an electronic device enclosure, as discussed herein with respect to FIGS. 1A-4.

In operation 502, an electronic device enclosure including at least one aperture is provided. More specifically, at least one aperture may be formed through an enclosure of an electronic device for allow components of the electronic device to be viewable by a user and/or protected from contaminants.

In optional operation 504, an adhesive may be applied to at least one of the at least one aperture formed through the electronic device enclosure, and/or a component configured to be positioned within the aperture. That is, an adhesive may be applied to a portion of the sidewalls of the apertures formed through the electronic device enclosure. Additionally, an adhesive may be applied to a portion of the component that may contact the sidewalls of the apertures when the component is positioned within the aperture. As discussed herein, the adhesive may be applied to the aperture and/or the component to adhere the component to the enclosure and/or hide a weld formed between the electronic device enclosure and the component.

In operation 506, the component may be positioned within the aperture formed through the electronic device enclosure. More specifically, a component of the electronic device, formed from a transparent material, may be positioned within and/or received by the aperture of the electronic device enclosure. As discussed herein, the aperture of the enclosure may include a complementary shape to the shape of the component. That is, the sidewalls of the aperture of the enclosure may be complementary to the sidewalls of the component positioned within the enclosure. In non-limiting examples, and as discussed herein, the component positioned within the aperture of the enclosure may include a window for a camera system (see, FIGS. 2A-2D), a transparent layer for a display (see, FIG. 3), or a button (see, FIG. 4).

The component positioned within the aperture of the electronic device enclosure may include additional processes prior to, or subsequent to, the positioning in operation 506. More specifically, the an external surface of the component may be treated, and the internal surface of the component positioned opposite the external surface may be treated. The external surface and internal surface may undergo surface treatments, such as, lapping, planing, grinding, or polishing. Additionally, prior to, subsequent to, and/or during the positioning in operation 506, untreated sidewalls of the component may be substantially maintained. More specifically, the sidewalls of the component may remain substantially untreated, or may not undergo surface treatments, such that the sidewalls contain defects (e.g., cracks, depressions) formed during initially processes for creating the component.

The positioning in operation 506 may also include aligning the treated external surface of the component with an exterior surface of the electronic device enclosure. More specifically, when positioning the component within the aperture, the treated external surface of the component may be in planar alignment with an exterior surface of the enclosure. By aligning the external surface of the component and the exterior surface of the enclosure, the surface of the electronic device including the component and/or the aperture may be substantially continuous and planar.

In operation 508, the component may be welded to the electronic device enclosure. More specifically, a laser beam may be projected through the component including the transparent material, and a portion of the sidewall of the aperture formed through the enclosure may be exposed to the projected laser beam. The laser beam wavelength may be dependent on the material composition of the component, such that material of the component is transparent to the laser beam. As a result of the laser beam being projected through the component, the material of the component may also include a melting point greater than the melting point of the material forming the enclosure. When the laser beam is exposed to a portion of the sidewall of the enclosure through the component, the exposed portion of the sidewall may include a solidified molten pool that may weld the sidewall of the component to the sidewall of the aperture of the enclosure. The welding may also include laser welding an entire perimeter of the component to the at least one aperture formed through the enclosure. By welding the perimeter of the component, it may substantially ensure that the component is fixed to the enclosure.

Turning to FIGS. 6A-6D, a sample portion of an electronic device 100 (see, FIGS. 1A and 1B) including an enclosure 102 and a window 122, is shown undergoing various operations of method 500 of FIG. 5. It is understood that similarly numbered components may function in a substantially similar fashion. Redundant explanation of these components has been omitted for clarity.

Figure 6A:
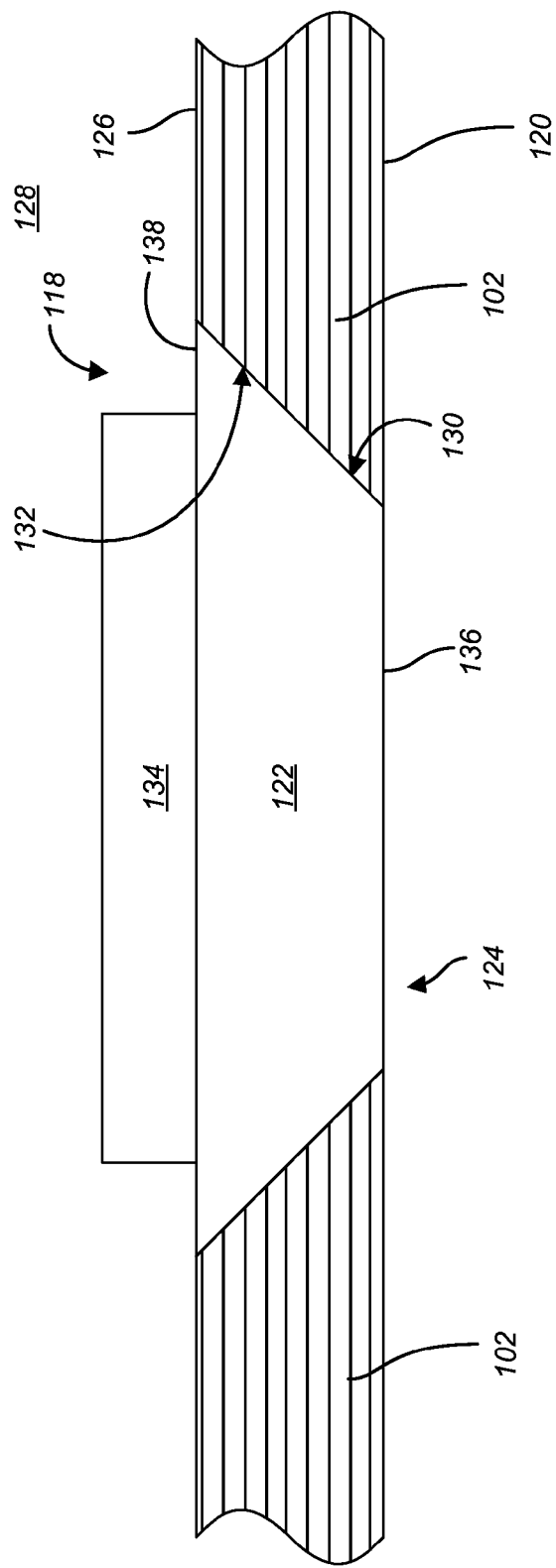
FIGS. 6A-6D show illustrative views of a portion of an electronic device, including a window and an enclosure, undergoing processes of securing as depicted in FIG. 5, according to embodiments.

As shown in FIG. 6A, enclosure 102 of electronic device 100 (see, FIGS. 1A and 1B) may be provided and may include an aperture 124, as discussed herein. The provided enclosure 102 including the aperture 124, as shown in FIG. 6A, may correspond to operation 502 of FIG. 5. Aperture 124 of enclosure 102 may include angled sidewalls 130, which may complement or correspond to untreated sidewalls 132 of window 122, as discussed herein.

Also shown in FIG. 6A, window 122 may be positioned within aperture 124 of enclosure 102, as discussed herein. More specifically, untreated sidewalls 132 of window 122 may contact sidewalls 130 of enclosure 102, and treated external or first surface 136 may be in planar alignment with exterior or back surface 120 of enclosure 102. Window 122 positioned within aperture 124 of enclosure 102, as shown in FIG. 6A, may correspond to operation 506 of FIG. 5.

Although not shown in FIG. 6A, it is understood that an adhesive may also be applied to the aperture formed through enclosure 102 prior to the positioning of window 122 within aperture 124 of enclosure 102. More specifically, an adhesive 348 (see, FIG. 4) may be applied to sidewall 130 of aperture 124 to aid in adhering window 122 to enclosure 102 and/or hid a weld formed between enclosure 102 and window 122, as discussed herein. The applying of an adhesive to the aperture, if shown in FIG. 6A, would correspond to operation 504 in FIG. 5.

Figure 6B:
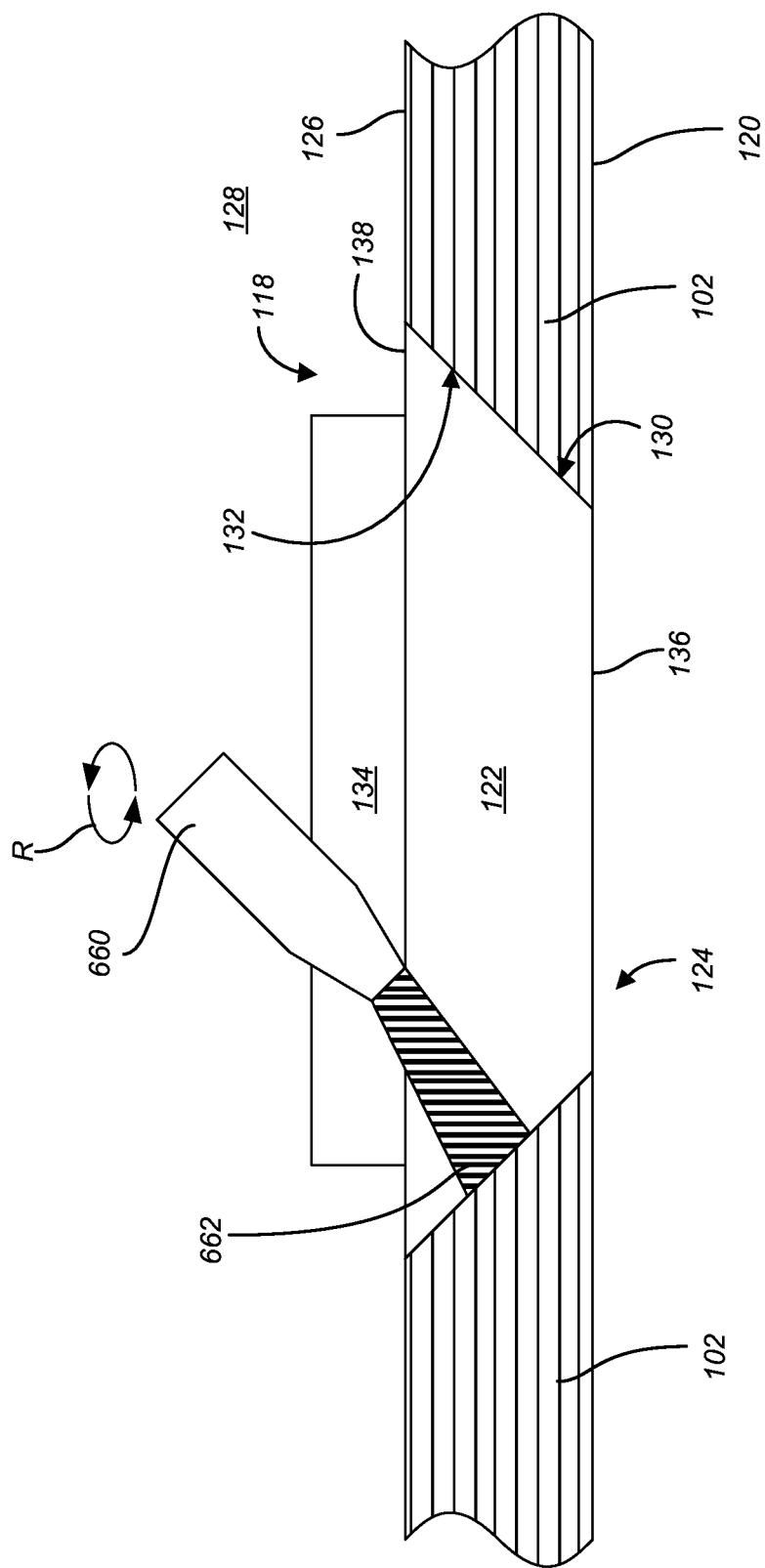
Figure 6C:
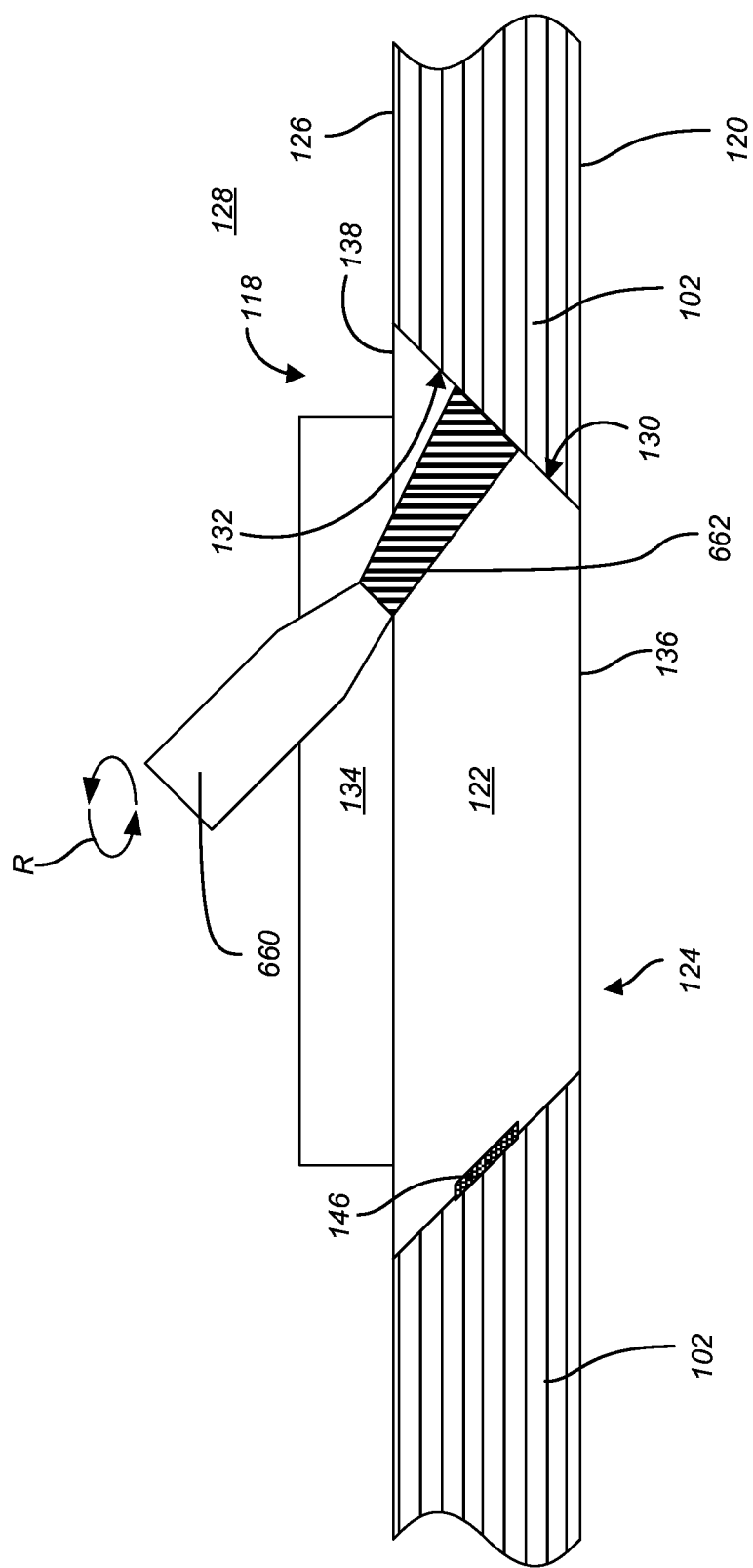
Figure 6D:
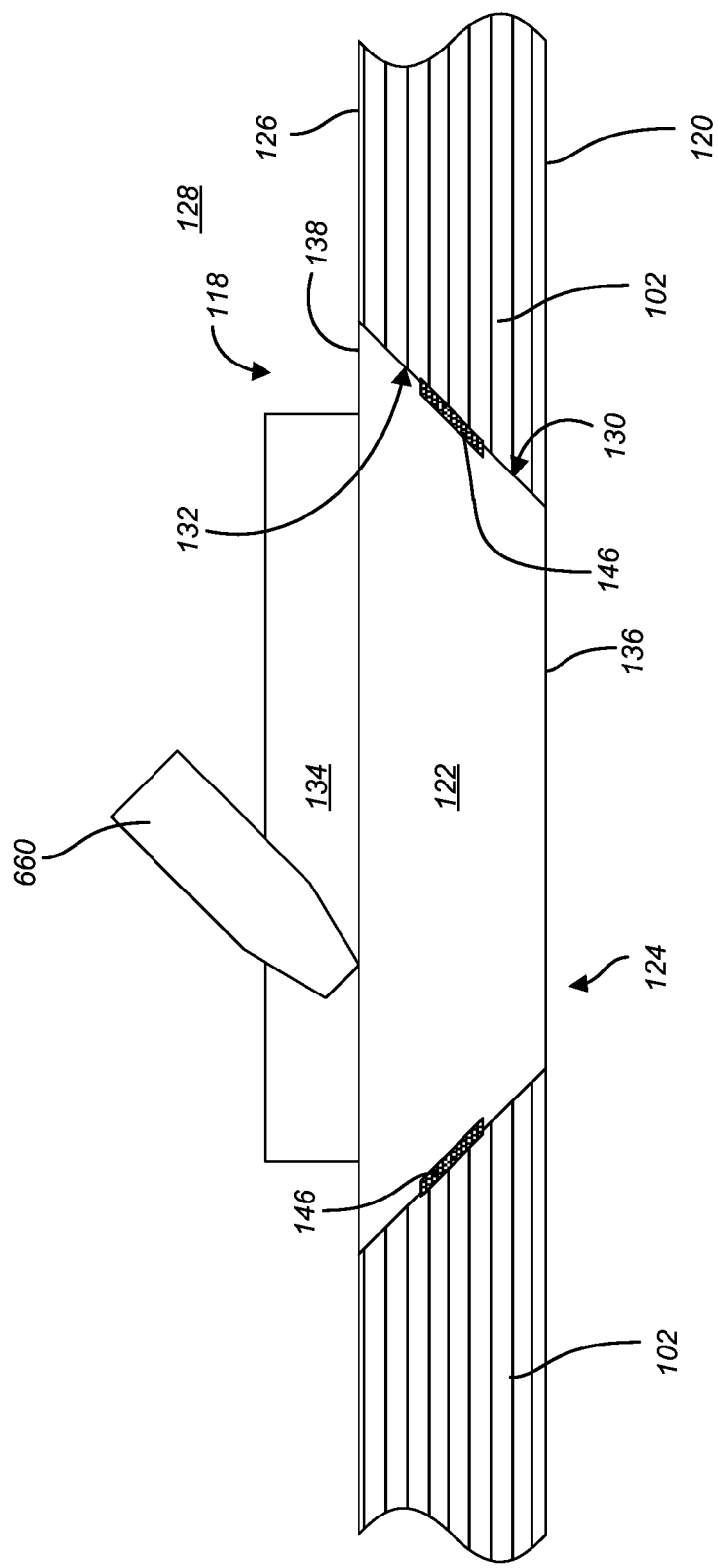

Turning to FIGS. 6B-6D, window 122 may be welded to enclosure 102, as discussed herein. Specifically, FIGS. 6B-6D show the progression of the laser welding process for welding window 122 to aperture 124 of enclosure 102. Window 122 welded to enclosure 102, as shown in FIGS. 6B-6D, may correspond to operation 508 in FIG. 5. As shown in FIG. 6B, the welding process may begin on a first side of aperture 124. Laser 660 may project a laser beam 662 through window 122, which includes a transparent material, to expose a portion of sidewall 130 of aperture 124 formed through enclosure 102. As discussed herein, laser 660 may include a predetermined wavelength that may be dependent on the transparency properties of the material forming window 122, such that window 122 is substantially transparent to laser beam 662 of laser 660. Additionally, and as discussed herein, the material forming window 122 may include a melting point higher than the material forming enclosure 102. As a result, window 122 may be substantially unaffected when laser beam 662 is projected through window 122 and a portion of sidewall 130 of enclosure 102 is exposed to laser beam 662, during the welding process.

In a non-limiting example, where window 122 is formed from sapphire and enclosure 102 is formed from aluminum, laser 660 may include an infrared laser, which may produce laser beam 662 having a 1064 nm wavelength, and 150 W average power. Laser 660 may be a pulsed laser capable of pulsing laser beam 662 in micro-second pulse widths. Because sapphire's melting point (e.g., approximately 2000° C.) is greater than aluminum's melting point (e.g., approximately, 1220° C.), laser beam 662 pulsing through window 122 may form a molten pool of the aluminum on sidewall 130, which may ultimately create weld interface 146 (see, FIG. 6C), without disrupting the sapphire forming window 122. In an additional non-limiting example, laser 660 may be a continuous wave laser. Distinct from the pulsed laser, continuous wave laser may provide a continuous laser beam 662 through window 122, which includes a transparent material, to expose a portion of sidewall 130 of aperture 124 formed through enclosure 102, as discussed herein.

Window 122 may be substantially circular in shape (see, FIG. 1B). As such, and as shown in FIGS. 6B and 6C, laser 660 may rotate in direction (R) to perform a circumferential weld of window 122 and enclosure 102. The circumferential weld performed by laser 660 may provide a complete perimeter weld of window 122 to ensure window 122 is fixed to enclosure 102, as discussed herein. During the circumferential welding process, as depicted in FIGS. 6B and 6C, the exposed portion of sidewall 130 of enclosure 102 may form a molten pool that may subsequently solidify, to form weld interface 146. Specifically, when comparing FIGS. 6B and 6C, the portion of sidewall 130 that is exposed to laser beam 662 in FIG. 6B may be solidified to form weld interface 146 by the time laser beam 662 is projected on a portion of sidewall 130 positioned opposite weld interface 146, as shown in FIG. 6C.

As shown in FIG. 6D, window 122 may be completely welded to enclosure 102. More specifically, laser 660 may weld the entire perimeter of window 122 and may be positioned back in alignment with the portion of sidewall 130 initially exposed to laser beam 662, as shown in FIG. 6B. As result of welding the entire perimeter of window 122, laser 660 may no longer expose sidewalls 130 of aperture 124 formed through enclosure 102 with laser beam 662. Additionally, as shown in FIG. 6D, weld interface 146 may be formed completely around window 122, for welding and/or fixing window 122 to enclosure 122.

Although the material forming window 122 is discussed herein as having a melting point higher than the material forming the enclosure 102, it is understood that window 122 may also include a melting point equal to or less than the melting point of the material forming the enclosure 102. That is, in non-limiting examples, the material forming window 122 may include a melting point equal to, or less than the material forming enclosure 102. In these examples, window 122 may remain substantially unaffected when laser beam 662 is projected through window 122, as discussed herein, or may be minimally altered by laser beam 662. In these non-limiting examples, when window 122 is exposed to laser beam 662, window 122 may be substantially unaffected by laser beam 662, as discussed herein, or laser beam 662 may cause a minimal, surface alteration to window 122. Although the material forming window 122 may include a melting point equal to, or less than the material forming enclosure 102, window 122 may remain substantially unaffected or minimally affected as a result of laser beam 662 including a wavelength that provides window 122 to be substantially transparent to laser beam 662 of laser 660. Where window 122 includes a minimal surface alteration as a result of laser beam 662, the minimal surface alteration may remain on second surface 138 of window 122 undetectable and/or unseen by a user or, may be removed by performing additional surface treatment processes (e.g., buffing, polishing) on second surface 138 of window 122.

By welding the components (e.g., window, button) of the electronic device to the enclosure of the electronic device, the need for an adhesive to bind the components is unnecessary. Also, in welding the components of the electronic device to the enclosure, the need for decorative ink to hide the coupling technique (e.g., the weld) may be unnecessary, as the weld is substantially small and/or undetectable by a user of the electronic device. Additionally, by welding the components to the enclosure of the electronic device, a substantially permanent coupling may be formed between the components and the enclosure. Furthermore, by forming the laser weld between the components and the enclosure by emitting a laser beam through the transparent material forming the components, the weld may be substantially hidden from the user of the electronic device. That is, by laser welding the respective components, the weld may be substantial undetectable by, or concealed from, the user of the electronic device. Not only will the laser weld improve the coupling strength between the first and second component, but it may also improve the cosmetic features of the electronic device.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not target to be exhaustive or to limit the embodiments to the precise forms disclosed. It will be apparent to one of ordinary skill in the art that many modifications and variations are possible in view of the above teachings.

We claim:

1. An apparatus, comprising:
   an enclosure having a first melting temperature, comprising:
      an exterior surface;
      an interior surface opposite the exterior surface; and
      a sidewall extending between the exterior and interior surfaces and defining an aperture;
   a transparent component positioned within the aperture and having a second melting temperature that is greater than the first melting temperature and having a first surface and a second surface opposite the first surface connected by a side surface defining an edge having at least one surface defect, wherein the at least one surface defect is the result of a forming process of the transparent component comprising a crack or depression; and
   a laser weld formed between the sidewall of the enclosure and the edge of the transparent component and encircling the transparent component within the aperture, the laser weld generated by passing a laser beam onto the sidewall to heat the sidewall to a temperature that is greater than first melting temperature and less than the second melting temperature, wherein
   the laser weld includes a portion of the enclosure filling the at least one surface defect of the transparent component.

2. The apparatus of claim 1, wherein the enclosure comprises at least one of:
   sapphire;
   metal;
   glass; or
   plastic.

3. The apparatus of claim 1, wherein the transparent component comprises at least one of:
   sapphire;
   glass; or
   plastic.

4. The apparatus of claim 1, wherein a size of the aperture at the interior surface of the enclosure is greater than a size of the aperture at the exterior surface.

5. The apparatus of claim 1, wherein the sidewall includes a bezel portion.

6. The apparatus of claim 1, wherein the sidewall is angled and the edge is beveled.

7. The apparatus of claim 1, wherein the first and/or second surfaces of the transparent component is/are treated.

8. The apparatus of claim 1, wherein the aperture is substantially circular.

9. The apparatus of claim 1, wherein the transparent component includes at least one of:
   a button
   a transparent layer for a display; or
   a window for a camera system.

10. The apparatus of claim 1, wherein the transparent component forms at least a portion of an exterior surface of an electronic device.

11. A method for forming an apparatus comprising:
    providing an enclosure having a first melting temperature, the enclosure comprising:
       an exterior surface;
       an interior surface opposite the exterior surface; and
       a sidewall extending between the exterior and interior surfaces and defining an aperture;
    positioning a transparent component having a second melting temperature that is greater than the first melting temperature within the aperture, the transparent component having a first surface and a second surface opposite the first surface connected by a side surface defining an edge having at least one surface defect, wherein the at least one surface defect is the result of a forming process of the transparent component comprising a crack or depression; and
    forming a laser weld between the sidewall of the enclosure and the edge of the transparent component that encircles the transparent component within the aperture, the laser weld is generated by a laser beam heating the sidewall to a temperature that is greater than first melting temperature and less than the second melting temperature, wherein
    the laser weld includes a portion of the aperture filling the at least one surface defect of the transparent component.

12. The method of claim 11, further comprising:
    surface treating a first surface of the transparent component; and
    surface treating a second surface of the transparent component opposite the first surface.

13. The method of claim 12, wherein the positioning comprises aligning the treated first surface of the transparent component and the exterior surface of the enclosure.

14. The method of claim 11, further comprising:
    prior to the positioning of the component within the aperture, applying an adhesive to at least one of:
       the aperture; or
       the window.

15. The method of claim 11, wherein
    the forming process comprises at least one of:
       cutting; or
       shaping.

16. The method of claim 11, wherein the laser weld is generated by passing a laser beam through the transparent component onto the sidewall.

17. An apparatus, comprising:
    an enclosure having a first melting temperature, comprising:
       an exterior surface;
       an interior surface; and
       a sidewall formed on interior surface defining an aperture;
    a transparent component positioned within the aperture and having a second melting temperature that is greater than the first melting temperature and having a first surface and a second surface opposite the first surface connected by a side surface defining an edge having at least one surface defect, wherein the at least one surface defect is the result of a forming process of the transparent component comprising a crack or depression; and a laser weld formed between the sidewall of the enclosure and the edge of the transparent component and encircling the transparent component within the aperture, the laser weld is generated by a laser beam heating the sidewall to a temperature that is greater than first melting temperature and less than the second melting temperature, wherein the laser weld includes a portion of the enclosure filling the at least one surface defect of the transparent component.

* * * * *